United States Patent [19]

Horiike et al.

[11] 3,828,232

[45] Aug. 6, 1974

[54] SEMICONDUCTOR TARGET

[75] Inventors: Yashuhiro Horiike, Tokyo; Shunji Shirouzu, Kanagawa-ken; Shigeo Tsuji, Fujisawa; Nozomu Harada, Yokohama, all of Japan

[73] Assignee: Tokyo Shibaura Electric Company, Ltd.

[22] Filed: Feb. 28, 1973

[21] Appl. No.: 336,452

[30] Foreign Application Priority Data

| | | |
|---|---|---|
| Feb. 28, 1972 | Japan | 47-19704 |
| Feb. 28, 1972 | Japan | 47-19705 |
| Feb. 28, 1972 | Japan | 47-19706 |

[52] U.S. Cl. .................... 357/31, 357/89, 357/90, 357/14

[51] Int. Cl. .................... H01l 15/00

[58] Field of Search.. 317/235 NA, 235 AM, 235 F, 317/234 U

[56] References Cited

UNITED STATES PATENTS

| | | | |
|---|---|---|---|
| 3,386,865 | 6/1968 | Doo | 148/175 |
| 3,534,234 | 10/1970 | Clevenger | 317/235 |
| 3,611,058 | 10/1971 | Jordan | 317/234 |
| 3,648,125 | 3/1972 | Peltzer | 317/235 |
| 3,649,889 | 3/1972 | Hart | 317/235 R |
| 3,707,657 | 12/1970 | Veith | 317/235 R |
| 3,737,702 | 6/1973 | Kooi | 313/66 |

*Primary Examiner*—Martin H. Edlow
*Attorney, Agent, or Firm*—Oblon, Fisher, Spivak, McClelland & Maier

[57] ABSTRACT

A semiconductor target comprises a semiconductor substrate and a diode array patterned on the substrate. Diodes are isolated from each other by an insulating film. A p-n junction plane of the diodes is designed to lie over the boundary plane of the substrate and the insulating film.

7 Claims, 3 Drawing Figures

SEMICONDUCTOR TARGET

BACKGROUND OF THE INVENTION

1. Field of the Invention

The present invention generally relates to a semiconductor photoelectric converting target or an electron multiplying target of an image tube used in television and other fields.

2. Description of the Prior Art

A silicon diode array target is known to have a higher sensitivity for visible light than the usual photoconductive target and it displays a several times greater electron multiplication effect in response to electron bombardment. These characteristics are desirable when the array is used as a vidicon camera tube of ordinary image pick up and as a silicon electron multiplying tube for a low illuminated image pick up.

In the past, a conventional silicon diode array vidicon target was manufactured by a so-called silicon planar technique. On the side of an electron beam scanned surface of an *n*-type silicon substrate, a plurality of isolated *p*-type regions was provided. The *n*-type regions of the electron beam scanned surface were masked with a silicon oxide layer. When the target was scanned by electron beams, the silicon oxide insulation layer was charged with electrons and became negative. The adjacent *p*-type regions were electrically connected because of a channel effect caused by a negative charging phenomenon of the silicon oxide layer. This was a cause of resolution deterioration and a mosing phenomenon. The mosing phenomenon is a white point spread on a television picture triggered by overcurrent at a defect of the p-n junction of a diode, and its adjacent diodes are rapidly changed to a conductive state.

In order to decrease such a defect, it was proposed to coat a semi-insulating material such as Cd Te, $Sb_2 S_3$ or GaAs on the electron beam scanned surface to prevent charging, or to select a low specific resistivity substrate. However, this was unsatisfactory because of deterioration of the semi-insulating material and decrease of electron beam acceptance in the former case, and decrease of threshold voltage in the latter case.

Further, with the *p*-type impurity diffusing process, many lattice defects were introduced into the diffused areas, especially around the peripheral region of the silicon oxide insulation layer even if a substrate having no lattice defect was used. The mobility of minority carriers was decreased because they were trapped and recombined by the lattice defects resulting in an adverse influence to sensitivity or causing an increasing dark current.

SUMMARY OF THE INVENTION

Accordingly, it is one object of the present invention to provide a new and improved unique semiconductor target which is capable of decreasing the influence of the mosing pehnomenon caused by negative charge of the insulating layer.

Still another object of this invention is to provide a new and improved unique semiconductor target which does not suffer from an undesirable influence of lattice defects introduced with an impurity diffusion process.

A still further object of this invention is to provide a new and improved unique semiconductor target which is capable of reducing a dark current, residual image and fade out phenomenon.

Briefly, in accordance with this invention, the foregoing and other objects are in one aspect attained by a semiconductor substrate with one type of conductivity, an insulating layer which is disposed on the semiconductor substrate and provided with a plurality of holes, a first semiconductor region which is disposed in the holes and of the same type of conductivity as that of the semiconductor substrate, a second conductor region which is disposed on the first semiconductor region and of an opposite type of conductivity as that of the substrate. The boundary plane of the first and second semiconductor regions is formed over a plane which forms a boundary between the substrate and the insulating layer.

BRIEF DESCRIPTION OF THE DRAWINGS

A more complete appreciation of the invention will be readily obtained as the same becomes better understood by reference to the following detailed description when considered in connection with the accompanying drawings, wherein.

DETAILED DESCRIPTION OF THE PREFERRED EMBODIMENTS

Figure 1:
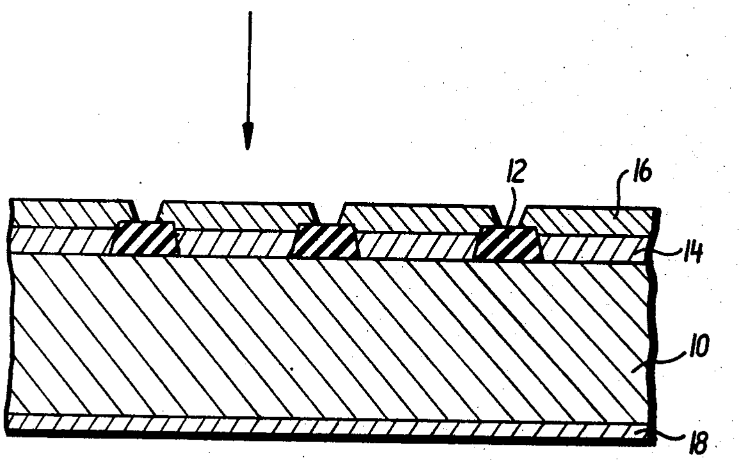
FIG. 1 is a schematic sectional view of one preferred embodiment of the semiconductor target according to the present invention.

Referring now to the drawings, wherein like reference numerals indicate identical or corresponding parts throughout the several views and more particularly to FIG. 1 thereof, wherein a semiconductor target 8 according to the present invention is shown. A silicon oxide layer 12 may be of 1.2 $\mu$ thickness and is made by an oxidation process on an *n*-type silicon substrate 10 with a specific resistivity of, for example, 10 $\Omega$ cm (donor impurity density equal to $5 \times 10^{14}$ atoms/$cm^3$). The silicon oxide layer 12 is patterned to form a plurality of holes using standard photolithographic techniques. The pattern, for example, forms rectangles of 10 $\mu$ length on 15 $\mu$ centers arranged in a square array.

In the manufacture, a semiconductor wafer is heated in a vessel to 1,100°C in an atmosphere containing $SiH_4$ and $AsH_3$ in order to grow *n*-type monolithic silicon layers 14 up to 2 $\mu$ on the silicon substrate 10 where the silicon oxide layers 12 are removed by a selective epitaxy process. A *p*-type impurity, for example, boron is diffused into the *n*-type layers 14 to form 1 $\mu$ thick *p*-type layers 16. A thin $n^+$-layer 18 is provided on the light emitting surface of the silicon substrate 10 to improve the collection efficiency of minority carrier holes by forming an accelerating field of holes.

The *n*-type layers 14 spread out over the silicon oxide layer as they grow higher. The layers 14 must not contact each other. It should be understood that when some layers 14 are over-grown and contact each other, they can be easily etched apart by using an etchant, such as hydrazine.

The semiconductor target 8 generates holes corresponding to the intensity of light admittance, and the holes diffuse to p-n junctions to raise the potential of *p*-type silicon layers 16. An electron beam, which is shown in the drawings as an arrow, scans the *p*-type regions 16 and neutralizes the potential of the *p*-type regions 16. The current to charge the junction capacitances is used as an image signal.

In the above-mentioned embodiment, lattice defects introduced with a *p*-type impurity diffusion process are concentrated in the peripheral region of the *p*-type layers 16 which overlies the silicon oxide 12. Thus it is easy to obtain complete p-n junctions with no lattice defects which trap holes before they reach the p-n junction.

Accordingly, the photoelectric converting efficiency is improved and a dark current is also decreased because of the desirable diode characteristics. Moreover, the semiconductor target of this invention has no semi-insulating material layer overspreading the electron beam scanned surface of the silicon substrate and the exposed silicon oxide layer 12 is very small compared with that made by the planar method.

Accordingly, undesirable characteristics, such as mosing phenomenon and fade out phenomenon, of the prior semiconductor target are decreased and electron beam acceptance and residual image are remarkably improved.

Regarding the construction of the semiconductor target as mentioned above, another improvement is easily obtained. That is, the impurity density of the silicon substrate of the prior semi-conductor target is determined by balancing junction capacitance elimination against prevention of channel effect beneath the silicon oxide layer 12. On one hand, the higher the impurity density of the substrate, the more effectively the channel effect is prevented, while on the other hand, the lower the impurity density, the smaller the junction capacitance which causes a residual image.

In the above-mentioned embodiment it is possible to independently select the impurity density under the silicon oxide layer 12 and the impurity under the p-n junction. The impurity density of the silicon substrate 10 is selected to not produce an inversion layer under the silicon oxide layer 12, with the applied target voltage. Where the applied target voltage is 10 volts, $10^{17}$ $^{atoms}/cm^3$ is enough for preventing a channel effect. When the impurity density of the *n*-type epitaxy layer 14 is selected to be so low as to give a desirable junction capacitance and then a value of, for example, $10^{14}$ $^{atoms}/cm^3$ gives a satisfactory result.

As described above, the semiconductor target of the above-mentioned construction has very good characteristics satisfying all the requirements for a semiconductor target with high resolution, long life, less residual image, less fade out phenomenon and no mosing phenomenon.

Figure 2:
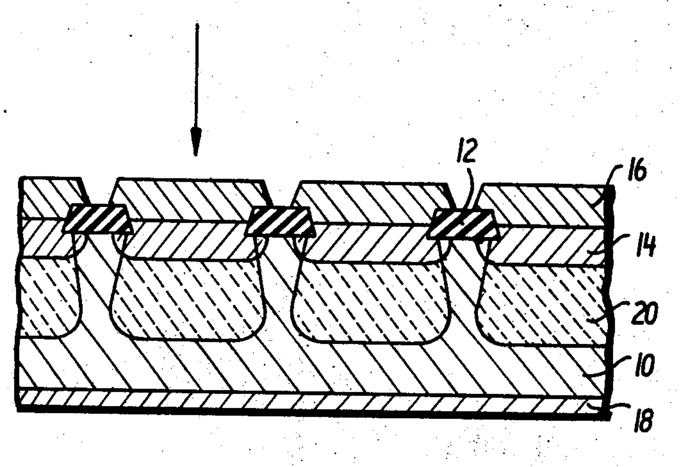
FIG. 2 is a sectional view of a semiconductor target according to another preferred embodiment of the present invention.

FIG. 2 shows another preferred embodiment of the present invention. An n-type silicon substrate 10 with a specific resistivity such as 40Ω cm (donor impurity density equal to $1.5 \times 10^{14}$ $^{atoms}/cm^3$) is heated in an oxygen containing atmosphere to form a 1 μ thick silicon oxide film 12. The silicon oxide film 12 is patterned to form a plurality of holes disposed in a square array similar to that described in the first embodiment. The silicon substrate 10 is dipped into an etchant which etches out unmasked portions of the silicon substrate, but does not etch out the silicon oxide film 12. An example is hydrofluoric acid.

Many recesses with, for example, 1 μ depth are formed on the silicon substrate 10. Sidewalls of the recesses underlie the silicon oxide film 12 and each recess is formed so as to not contact each other. After the recess forming process, $n^+$-type silicon layers 14 with an impurity density of, for example $5 \times 10^{15}$ $^{atoms}/cm^3$ which is higher than that of the substrate 10, are formed in the recess up to 2 μ height using the selective epitaxy process described in the first embodiment. Then *p*-type impurity is diffused into the $n^+$ - layer 14 to form *p*-type regions 16 with 1 μ depth.

The semiconductor target of the above-mentioned embodiment displays a desirable characteristic by controlling the width and impurity density of the $n^+$ - layer 14. That is, the width of a depletion layer 20 of the p-n junction can be made larger to reduce junction capacitance by controlling the width and impurity of the $n^+$ - layer 14. This fact contributes to an improved residual image, and the wide depression layer 20 prevents dispersion of holes which were generated by light admittance. A dark current is also decreased because the depression layer 20 at the boundary phase of the silicon oxide and silicon is limited in the $n^+$ - layer 14.

The condition to determine the desired impurity density and width for obtaining such a depletion layer 20 is explained hereinbelow Suppose X is the distance measured from the p-n junction boundary to the direction of the substrate, the width of the $n^+$ - layer 14 is $X_1$, the impurity density of the $n^+$ - layer 14 is $N_1$, the impurity density of the silicon substrate 10 is $N_2$, the applied voltage to the p-n junction is Vj, the width of the depletion layer 20 spreading into the substrate 10 is $X_2$, the dielectric constant of silicon is *Esi* and the space charged density is denoted as *P (X)*.

The width $X_2$ of the depletion layer 20 is determined by solving Poisson's equation which is written below.

$$d^2\, V(x)/d\, X^2 = -\, P\, (X)/Esi \qquad \text{(I)}$$

provided $$P(X) = N_1, \text{ where } 0 \leqq X \leqq X_1$$

$$P\,(X) = N_2, \text{ where } X_1 < X$$

By solving the above equation I, $X_2$ is denoted as:

$$X_2 = 2\, Esi/qN_2\, (Vj + \phi_d) + (1 - N_1/N_2)\, X^2, \qquad \text{(II)}$$

wherein (*q:* elementary electric charge) ($\phi_d$: diffusion potential difference)

The condition to make the width $X_2$ of the depletion layer 20 of the present invention larger than that of the conventional one is described herein below.

$$2\, Esi\, (Vj + \phi_d) + (1 - N_1/N_2)\, X_1^2\; 2\, Esi/q\, N_o\, (Vj + \phi_d) \qquad \text{(III)}$$

wherein $N_0$: Impurity density of the silicon substrate of conventional semiconductor target, ordinarily selected to be about $5 \times 10^{14}$ atom/$cm^3$ (10Ωcm in specific resistivity because of the aforementioned balancing requirement.)

Figure 3:
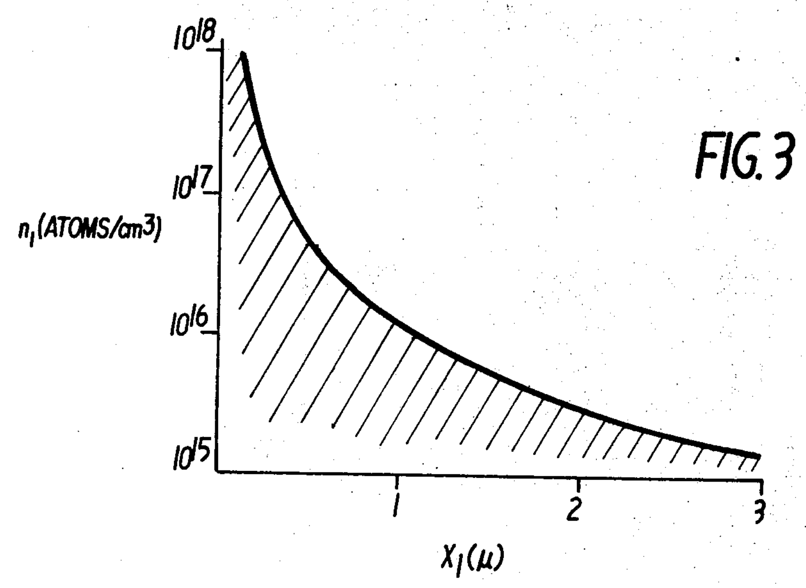
FIG. 3 is a graph which shows a boundary condition between the impurity density and the depth of depletion layer for satisfactory operation of the present invention.

By resolving the above equation substituting $N_0=5 \times 10^{14}$ atoms/cm$^3$ (10Ωcm in the specific resistivity) and $N_2=1.5 \times 10^{14}$ atoms/cm$^3$ (40Ωcm in specific resistivity) and $Vj$ equal to 10 V, the correlating area of $N_1$ and $X_1$ that satisfies the above condition is shown as a shaded area in FIG. 3, wherein the horizontal axis denotes the width of the $n^+$ - layer 14 and the vertical axis denotes the impurity density of the $n^+$ - layer 14.

In the embodiment of FIG. 2, the values of impurity density and width of the $n^+$ - layer 14 are selected to be in the shaded area of FIG. 3, so that the width of the depletion layer 20 is far larger than that of the conventional one to minimize the aforementioned defects.

The shaded area of FIG. 3 changes if the impurity density $N_2$ of the substrate and the junction applied voltage $Vj$ differs. However, it is apparent that the desirable correlation between the width and the impurity density of the $n^+$ - layer is achieved by a similar process.

The embodiment shown in FIG. 2 has the desirable characteristics that 1. a leakage current through the semi-insulating material film coated on the electric beam scanned surface is nullified because the semi-insulating film is unnecessary;
2. the mosing phenomenon is easily prevented because the $n^+$ - layer 14 is underlying the silicon oxide film 12 to form a channel between the diodes;
3. a dark current is reduced because the depletion layer at the boundary of silicon and silicon oxide is an $n^+$ layer;
4. the junction capacitance is reduced because the width of the depression layer is enlarged;
5. the dispersion of holes by diffusion is reduced to improve resolution becasue the width of the depression layer is enlarged Obviously, numerous modifications and variations of the present invention are possible in light of the above teaching. For example, a semiconductor other than silicon such as Ge, GaAs can be used and a diode array may be changed to a transistor array that is known to have a high amplitude. Also, the type of conductivity of the semiconductor may be reversed according to the desired characteristics. The aforementioned description was for the explanation of a semiconductor target for a photoelectric converting device such as a vidicon, but it is obvious that the semiconductor target of the present invention may be used as a silicon electron multiplying target which admits photoelectrons instead of light.

It is therefore to be understood that within the scope of the appended claims, the invention may be practiced otherwise than as specifically described herein.

What is claimed as new and desired to be secured by Letters Patent of the United States:

1. A semiconductor target comprising:

a semiconductor substrate having one type of conductivity;

an insulating layer in contact with and on a major surface of said substrate and which is provided with a plurality of holes;

a first semiconductor region in said holes in contact with said substrate and having the same conductivity type as that of said substrate and a different impurity density from that of said substrate;

a second semiconductor region in contact with said first semiconductor region and having an opposite type of conductivity as that of said substrate, wherein said boundary plane between said semiconductor substrate and said insulating layer and a boundary plane between said semiconductor region and said semiconductor substrate line in a same plane;

wherein a p-n junction between said first and second semiconductor regions is formed over a plane which forms a boundary plane between said semiconductor substrate and said insulating film.

2. A semiconductor target according to claim 1, wherein an impurity density of said substrate is lighter than that of said first semiconductor region.

3. A semiconductor target according to claim 2 wherein said substrate includes impurity density means to prevent a formation of an inverted layer caused by a charge on said insulating layer.

4. A semiconductor target according to claim 1, wherein a third semiconductor with the same type conductivity as the semiconductor substrate is formed on a surface of the semiconductor substrate which is opposite a surface of the semiconductor substrate having the insulating layer in contact therewith.

5. A semiconductor target comprising:

a semiconductor substrate having one type of conductivity;

an insulating layer in contact with and on a major surface of said substrate and which is provided with a plurality of holes;

a first semiconductor region in said holes in contact with said substrate and having the same conductivity type as that of said substrate and a different impurity density from that of said substrate;

a second semiconductor region in contact with said first semiconductor region and having an opposite type of conductivity as that of said substrate, wherein a portion of said first semiconductor region is disposed beneath said insulating layer;

whereby a p-n junction between the first and second semiconductor regions is formed over a plane which forms a boundary plane between said semiconductor substrate and said insulating layer.

6. A semiconductor target according to claim 5, wherein an impurity density of said first semiconductor region is heavier than that of said semiconductor substrate.

7. A semiconductor target according to claim 6, wherein said impurity density and the width of said first semiconductor region form a wide depletion layer in said semiconductor substrate.

* * * * *

UNITED STATES PATENT OFFICE
CERTIFICATE OF CORRECTION

PATENT NO. : 3828232

DATED August 6, 1974

INVENTOR(S) Yasuhiro Horiike et al

It is certified that error appears in the above-identified patent and that said Letters Patent are hereby corrected as shown below:

1. Column 2, line 41 and Column 3, line 1, Delete "8"

2. Column 2, line 52, Change "$SiH_4$ to ---$SiCl_4$---.

3. Column 4, lines 20 and 25, Change "depression" to ---depletion---.

4. Column 4, line 52, Change the equation to $$X_2 = \sqrt{2 E_{si}/qN_2 (V_j + \phi_d + (1 - N_1/N_2) X_1^2}$$

5. Column 4, line 60, Change the equation to $$\sqrt{2 E_{si}/qN_2 \cdot (V_j + \phi_d) + (1 - N_1/N_2) X_1^2} > \sqrt{2E_{si}/q No \cdot (V_j + \phi_d)}$$

Signed and sealed this 10th day of June 1975.

(SEAL)
Attest:

RUTH C. MASON
Attesting Officer

C. MARSHALL DANN
Commissioner of Patents
and Trademarks